US007192882B2

(12) United States Patent
Bergstedt et al.

(10) Patent No.: US 7,192,882 B2
(45) Date of Patent: Mar. 20, 2007

(54) COMPONENT FOR ELECTROMAGNETIC WAVES AND A METHOD FOR MANUFACTURING THE SAME

(75) Inventors: Leif Bergstedt, Sjömarken (SE); Spartak Gevorgian, Göteborg (SE); Marica Gustafsson, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/500,310

(22) PCT Filed: Dec. 27, 2002

(86) PCT No.: PCT/SE02/02457

§ 371 (c)(1),
(2), (4) Date: May 25, 2005

(87) PCT Pub. No.: WO03/056657

PCT Pub. Date: Jul. 10, 2003

(65) Prior Publication Data

US 2005/0215020 A1 Sep. 29, 2005

(30) Foreign Application Priority Data

Dec. 28, 2001 (SE) .................................... 0104442

(51) Int. Cl.
*H01L 21/302* (2006.01)

(52) U.S. Cl. ............... 438/745; 438/753; 257/E21.221; 257/E21.223

(58) Field of Classification Search .................. 438/52, 438/498, 745, 747, 753, 750; 333/219
See application file for complete search history.

(56) References Cited

U.S. PATENT DOCUMENTS

| | | | | |
|---|---|---|---|---|
| 5,821,836 | A | 10/1998 | Katehi et al. | |
| 6,362,706 | B1 * | 3/2002 | Song et al. | 333/219 |
| 2002/0008078 | A1 * | 1/2002 | Hatamura et al. | 216/11 |
| 2004/0056560 | A1 * | 3/2004 | Wang et al. | 310/311 |

* cited by examiner

*Primary Examiner*—Quoc Hoang
(74) *Attorney, Agent, or Firm*—Nixon & Vanderhye, P.C.

(57) ABSTRACT

The present invention relates to a method for fabricating a cavity in substrate for a component for electromagnetic waves, the method comprising providing said cavity by removal of material from said substrate by removal of material by immersing the substrate in a liquid bath of a chemical etchant, so that resultant cavity has a top and a bottom side and sidewalls, and said cavity at one of said top and/or bottom sides exhibits an at least a four sided opening having an opening with at least two different adjacent angles. The invention also relates to the component for microwave applications.

6 Claims, 6 Drawing Sheets

COMPONENT FOR ELECTROMAGNETIC WAVES AND A METHOD FOR MANUFACTURING THE SAME

This application is the US national phase of international application PCT/SE02/102457 filed 27 Dec. 2002, which designated the US. PCT/SE02/102457 claims priority to SE Application No. 0104442.9 filed 28 Dec. 2001. The entire contents of these applications are incorporated herein by reference.

TECHNICAL FIELD OF THE INVENTION

The present invention relates to a method for fabricating and assembling a component for electromagnetic waves. The component comprises a substrate provided with a cavity.

BACKGROUND OF THE INVENTION

The growing use of micro or millimetre frequencies, especially within wireless communications requires low-loss, high Q passive components. One important aspect is the fabrication process of these components, which must be inexpensive and allow batch processing.

Filters, for example, are one of the most important components. The prior art cavity filters or other microwave or millimetre wave elements made in micromachined technique appear as they were milled in metal, i.e. they have perpendicular angles in quadratic and square shaped "boxes". These are simple to compute and easy to etch, for example, if low productive dry etching method is used.

It is known to etch a [110] silicon substrate by means of fast wet etching methods; however, they follow crystalline structure, which usually are approximately 60 degrees. Some cheap sensors for air bags, for example, are designed in geometrical shapes that suite wet etching. These sensors do not use radio frequencies or cavities but through vibrations they sense motion and they are produced by etching off silicon volumes.

Wet etching is a blanket name that covers the removal of material by immersing the wafer in a liquid bath of the chemical etchant. Wet etchants fall into two broad categories: isotropic etchants and anisotropic or preferential etchants.

Isotropic etchants attack the material being etched at the same rate in all directions. Anisotropic etchants attack the silicon wafer at different rates in different directions, and so there is more control of the shapes produced. Some etchants attack silicon at different rates depending on the concentration of the impurities in the silicon (concentration dependent etching).

Micromachined filters in which the cavities are attached to a metallic layer and the "cap" of the filter having slot connection made through conventional circuit board manufacturing technique are described in "A high performance K-Band diplexer using high-Q micromachined cavities", Michael J. Hill et al, department of Electrical and Computer Engineering, University of Arizona, Tucson, Ariz. 85721-0104. According to this paper, which is directed at microwave diplexers two high Q cavity resonators, a Duroid-based high performance diplexer has been designed, fabricated and measured. This diplexer shows transmit/receive bandwidths of 2.39% and 1.8% and insertion losses of 2.38 dB and 2.89 dB, respectively. Channel centre frequencies of 18.8 GHz and 20.7 GHz provide a channel separation of approximately 9% and channel-to-channel isolation greater than 24 dB. Utilizing machined aluminium cavities and a Duroid substrate the diplexer design provides insight into cavity based diplexer construction, allowing for the design of a silicon based micromachined cavity diplexer. Simulation results from this silicon-based diplexer are also presented. One disadvantage with machined filters in Duroid-based technique is not being suitable for low cost batch production. In addition large tolerances do not allow fabrication of filters with desired performances.

Cavities having inclined walls are known through "A Finite Ground Coplanar Line-To-Silicon Micromachined Waveguide Transition", James P. Becker et al, IEEE Transactions on Microwave Theory and Techniques, Vol. 49, No. 10 October 2001. A channel is etched through a wet anisotropic etching. The channel has a triangular cross-section. Thus, this document concerns another planar etching technique, intended for high frequency applications.

BRIEF SUMMARY

The main object of the present invention is to provide a microwave or millimetre wave element, such as a wave guide, resonator, filter, diplexer or the like having a substrate made through removal of material by immersing the wafer in a liquid bath of the chemical etchant or wet etching, which is a more cost effective process than dry etching.

Another object of the present invention is to provide a filter arrangement, which is suitable for silicon etched large-scale production. Another object of the present invention is to provide a cost effective high performance filter for commercial radio equipment, such as Bluetooth, mobile radio communicators, base station antennas etc., and especially for high frequency applications.

Thus, the technology presents a method for fabricating a cavity on a substrate for a component for electromagnetic waves. The method comprises providing said cavity by removal of material from said substrate by removal of material by immersing the substrate in a liquid bath of a chemical etchant, so that resultant cavity has a top and a bottom side and sidewalls, and said cavity at one of said top and/or bottom sides exhibits an at least a four sided opening having at least two different adjacent angles. According to one embodiment, the component further comprises a conductive layer arranged as a ground plane covering said substrate, said ground plane being provided with at least one coupling slot and at least one conductor. The ground plane is connected to a component element, which is inserted into said cavity in said substrate. Preferably, the substrate is made of [110] silicon. The component is one of a filter, diplexer, resonators or matching networks. Preferably, the substrate is etched from both sides.

The technology also relates to a component for electromagnetic waves. The component comprises a substrate provided with a cavity being produced by removal of material from said substrate by immersing the substrate in a liquid bath of a chemical etchant. The cavity has a top and a bottom side and sidewalls and at one of said top and/or bottom sides exhibits an at least a four sided opening having at least two different adjacent angles. The component further comprises a conductive layer arranged as a ground plane covering said substrate. The ground plane is provided with at least one coupling slot and at least one conductor. The ground plane is connected to a component element, which is inserted into said cavity in the substrate. Most preferably, the substrate is made of [110] silicon. The component is one of a filter, diplexer, resonators or matching networks. The conductive plane is made of a metallic layer. According to one aspect of the invention, the cavity is arranged in a resonator arrangement with coplanar waveguide (CPW) couplings, comprising said substrate with micromachined through cavity with electroplated surface. Preferably, the cavity is made through preferential etching from the both sides of the substrate, having said sidewalls perpendicular to the surfaces of the cavity. In one embodiment the substrate is enclosed within a housing of dielectric material. The cavity has a length, said length $n\lambda$, where n=1, 2, . . . , wherein $\lambda$ is the wavelength.

Preferably, microstrips are arranged on a cap. The component is provided with low CPW or Coplanar Strip (CPS) waveguide input and output-coupling networks.

Preferably, the cavity is rhombus shaped while, end sections of said strips are angularly arranged relative cavity edges. In one embodiment, the end sections of the strips follow cavity edges, i.e. they have same angle as the cavity edges.

BRIEF DESCRIPTION OF THE DRAWINGS

In the following, the invention will be further described in a non-limiting way under reference to the accompanying drawings in which.

DETAILED DESCRIPTION OF THE EMBODIMENT

Figure 1A:
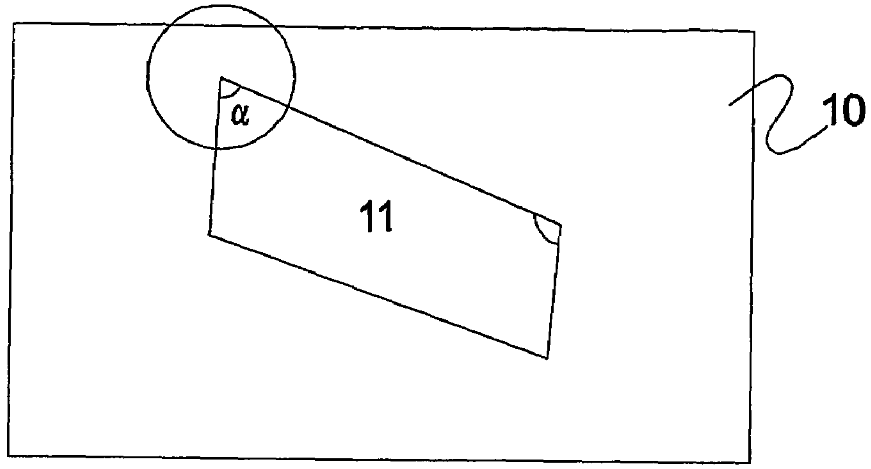
FIG. 1*a* schematically illustrates a top view of a substrate fabricated according to example embodiment.
Figure 1B:
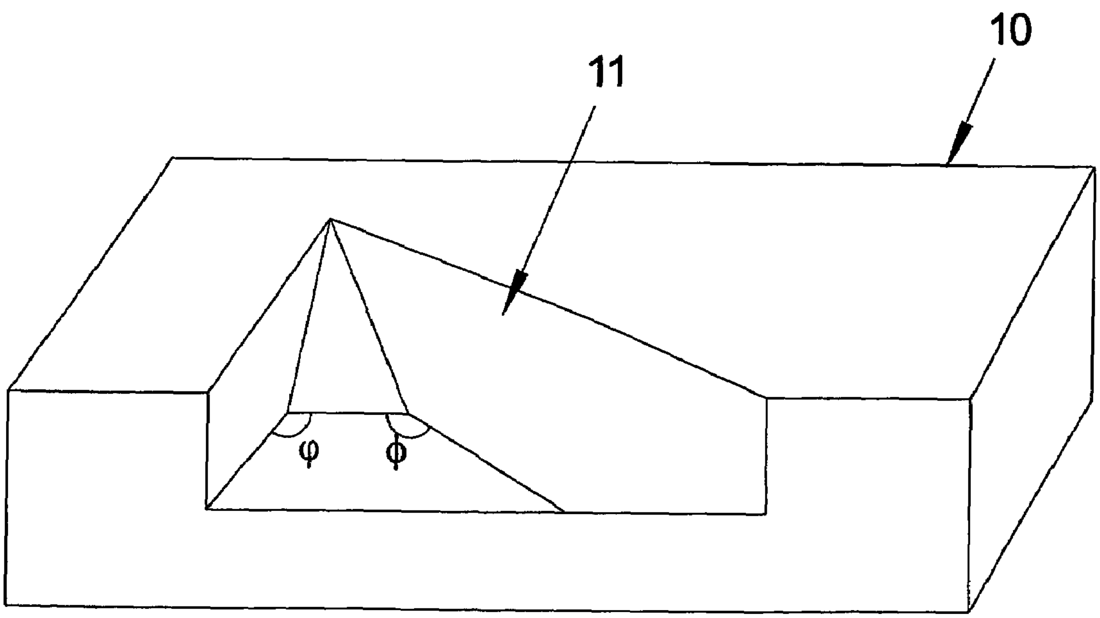
FIG. 1*b* is a cross section through the encircled section in FIG. 1, FIG. 2 schematically illustrates a top view of a substrate fabricated according to example embodiment.

A microwave filter or similar component is formed in cavities, which are adapted to the geometries that are shaped through wet an-isotropic (preferential) etching of silicon wafers. The filter is buried inside a substrate, parts of which constitute the walls of the filter. FIG. 1*a* illustrates a top view of the result of the wet etching in a silicon wafer 10. The cavity 11 does not exhibit a rectangular shape, rather an elongated rhombic shape (with no more than two sides having equal length), the corners of which can have the approximated angels of $\alpha \approx 70°$ and $\beta \approx 109°$. As illustrated in FIG. 1*b*, also the corners of the cavity 11 are inclined and exhibit angles $\sigma \approx 125°$ and $\phi \approx 125°$. For [110] orientation of silicon and angles of cavity in horizontal plane, the speed of the etching process is much faster and the cavities with walls normal to the wafer are formed. The etching is conducted from the horizontal plane (with respect to the plane of the drawing) using preferential etching orientation.

Figure 2:
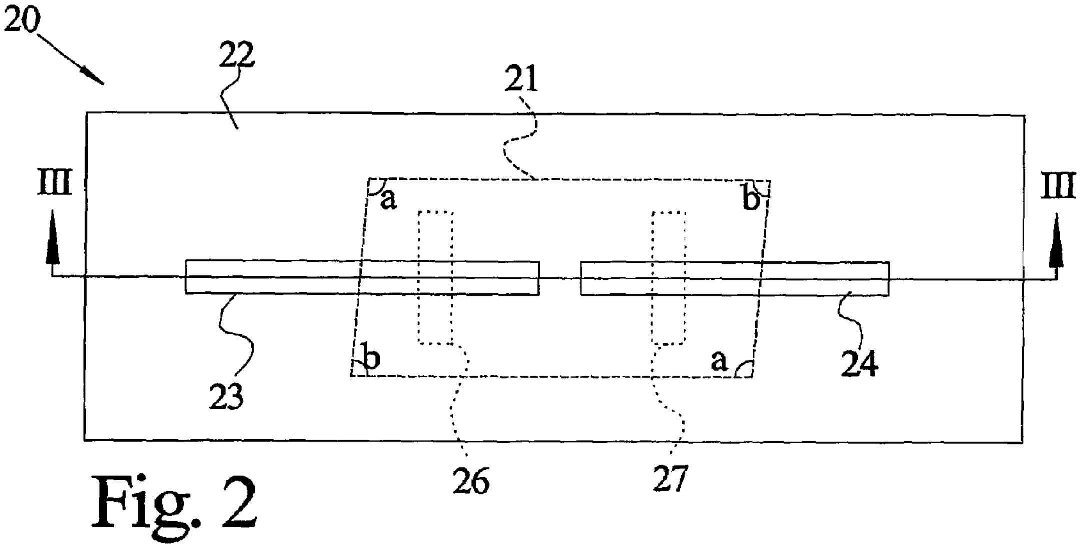
Figure 3:
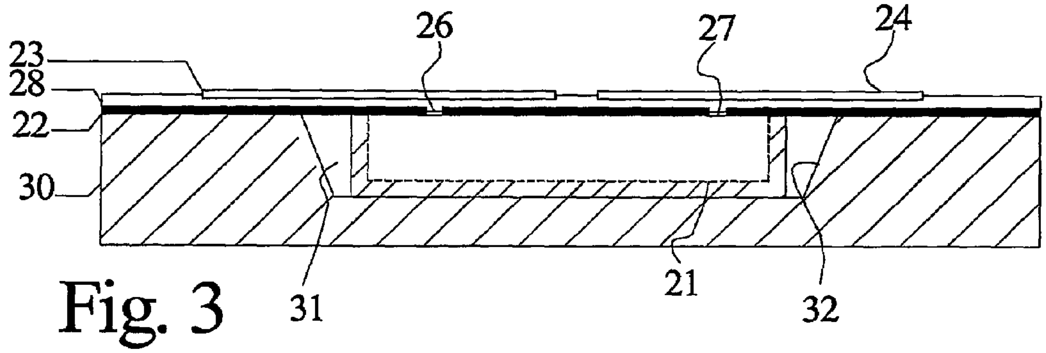
FIG. 3 is a cross section along line II—II in FIG. 2.

FIG. 2 is a top view of a filter arrangement 20 according to an example embodiment and FIG. 3 is a crosssectional view along line II—II. The filter is disclosed as an exemplary component and the method can be used to manufacture other similar components. The dashed line 21 illustrates the buried filter boundary in a cavity. The cavity is substantially shaped as an elongated rhombus, i.e. a quadrilateral in which the two adjacent corners a and b, seen from above, have different angles. Thus, as shown in FIG. 2, the cavity comprises an opening on at lease one side of said substrate. The opening comprises at lease four sides, two of the sides having an equal length, the equal length differing from lengths of remaining sides. In other words, no more than two sides of the cavity have equal length. The opening also has at lease two different adjacent angles. The cap 22 corn rises a metallic material layer or conductive plane constituting a ground plane. Two coupling microstrips, 23 and 24 extend over coupling slots 26 and 27, respectively. One microstrip and coupling slot combination, e.g. 23 and 26, acts as an input and the other microstrip and coupling slot combination, e.g. 24 and 27, acts as an output. The length of the input and output coupling strips 23, 24 over the cavity is at least $\lambda/4$ over the cavity, wherein $\lambda$ is the wavelength of the microwave. As can be seen in FIG. 2, the microstrips are arranged above a dielectric layer 28.

Figure 4:
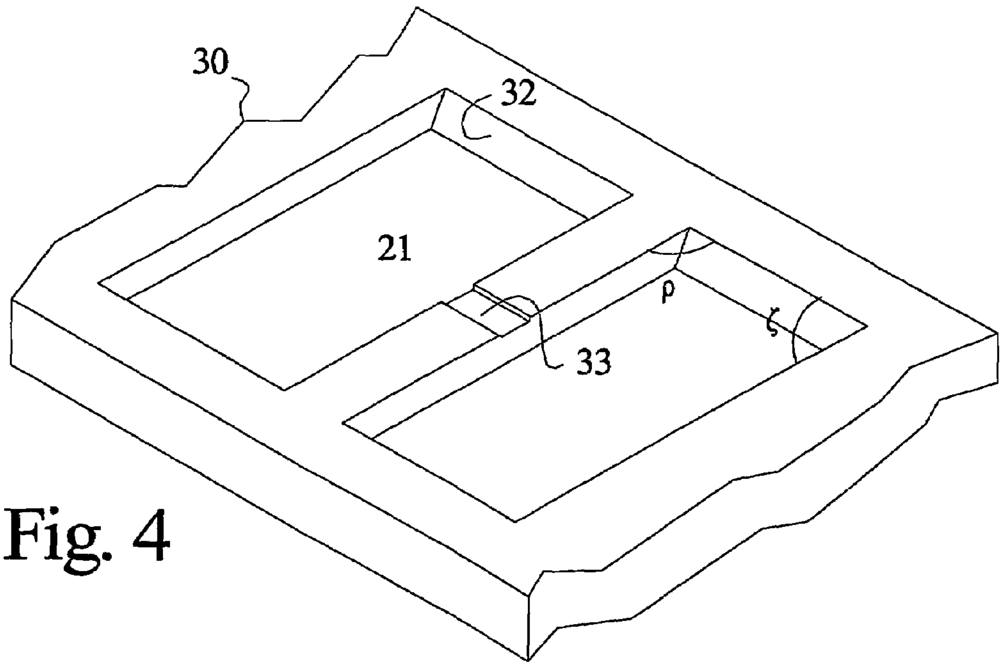
FIG. 4 is a perspective view of substrate in the component according to FIG. 2.

The substrate 30, as illustrated in FIGS. 2 and 3, is provided with a cavity 31, into which the filter is lowered. Due to the effects of the wet etching process, also the walls 32 of the cavity exhibit inclination, an angle of which can be as much as 60 degrees. However, this will not affect the performance of the filter. The cavities constituting filter chambers 20 can be inter-connected through passages 33, as shown in the perspective view of FIG. 4. Also, the angles $\rho$ and $\xi$ between the walls may be non-perpendicular, e.g., $\rho=109°$ and $\xi=70°$.

The fabrication steps, thus, comprise:

- Providing a conductive plane
- Arranging the conductive plane with coupling openings through milling etc
- Providing a microwave element on a first surface of said conductive plane
- Providing a dielectric layer on a second surface of said conductive plane
- Arranging microwave conductors on the dielectric layer
- Providing a silicon wafer with [110] orientation
- Exposing selected areas on said silicon plate to wet etching until cavities of desired depth are produced, and
- Covering (electroplating) the etched surfaces by a conductor (e.g. made of Cu, Au, etc.)
- Attaching said conductive plate to said silicon plate, e.g. by means of anodic bonding.

Figure 5A:
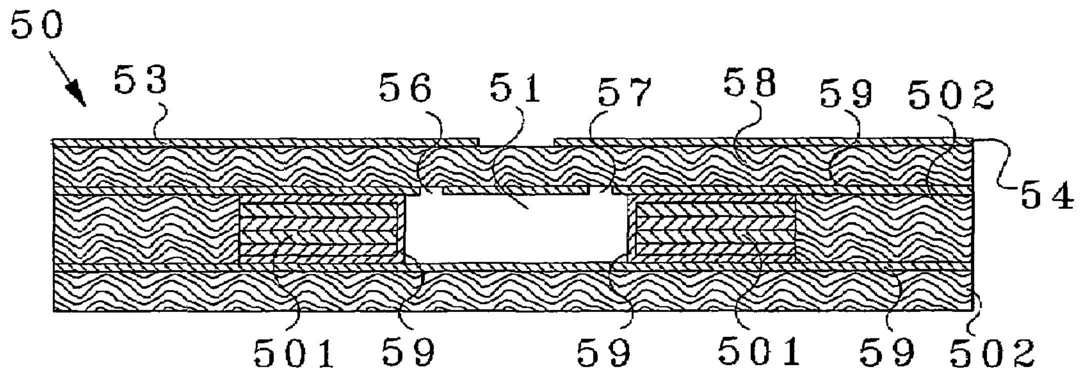
FIG. 5*a* is a cross-section through a cavity resonator arrangement according to example embodiment.
Figure 6A:
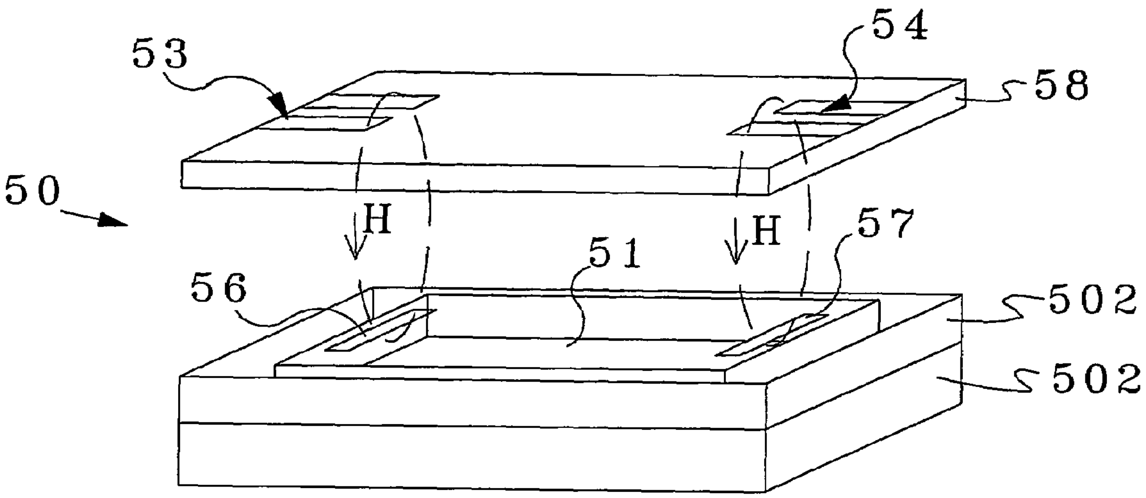
FIG. 6*a* is a perspective exploded view of a cavity resonator arrangement.
Figure 6B:
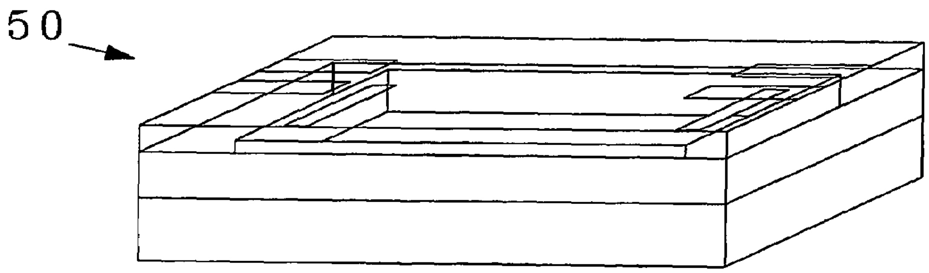
FIG. 6*b* is a perspective view of an assembled cavity resonator arrangement in FIG. 6*a*.

The above example relates to a multichip module. It is also possible to provide a cavity etched through the substrate. FIGS. 5*a*, 6*a* and 6*b* illustrate a cavity resonator arrangement 50 with coplanar waveguide (CPW) couplings, comprising a substrate 501 micromachined through cavity 51 with electroplated surface 59. FIG. 6*a* is an exploded view in perspective and FIG. 6*b* illustrates the assembled resonator arrangement 50. The substrate 501 consists of silicon and the conductive layer 59 may consist of copper (CU), silver (Ag) or any other suitable conductive material. The cavity is made through preferential etching from the both sides of the substrate. In this case the walls of the cavity are perpendicular to the surfaces of the cavity. The substrate is enclosed within a housing 502 of dielectric material. The microstrips 53 and 54 are arranged on the top layer or the cap 52.

Figure 5B:
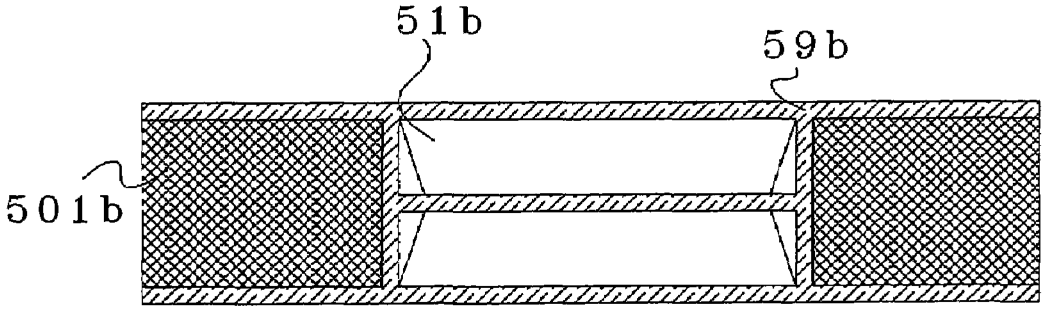
FIG. 5*b* is a cross-section through a cavity resonator arrangement according to another example embodiment.

FIG. 5*b* illustrates a silicon plate 50*b* micromachined through from both sides, i.e. both from to and bottom surfaces. The surfaces are electroplated 59*b*. The preferential etching is done with similar masks from both sides, thus, resulting in same etching shapes. In this case the walls of the cavity 51*b* are substantially perpendicular to the surface of the cavity.

The output and input coupling networks are CPW. In the prior art filters, the input and output coupling microstrip lines are usually at least λ/4 (λ=wavelength of the microwave signal) long over the cavity. To be able to provide input and output coupling sections electromagnetically isolated, the length of the cavity must be nλ, where n=1, 2, . . . . This makes the length of the cavity much longer than a minimum possible value λ/2.

Figure 7A:
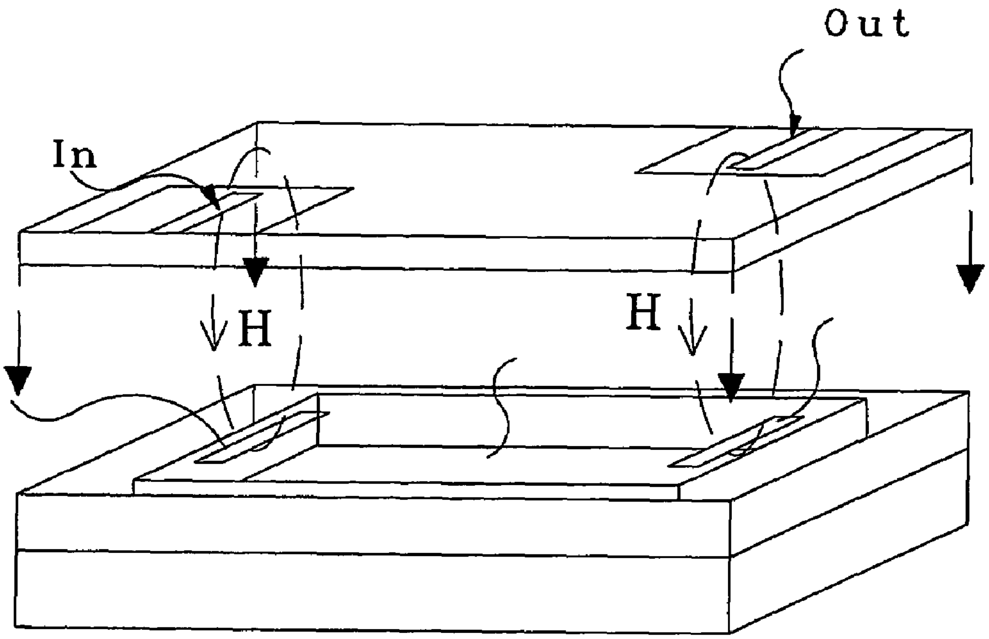
FIG. 7*a* is a perspective exploded view of a cavity resonator arrangement, according to another embodiment
Figure 7B:
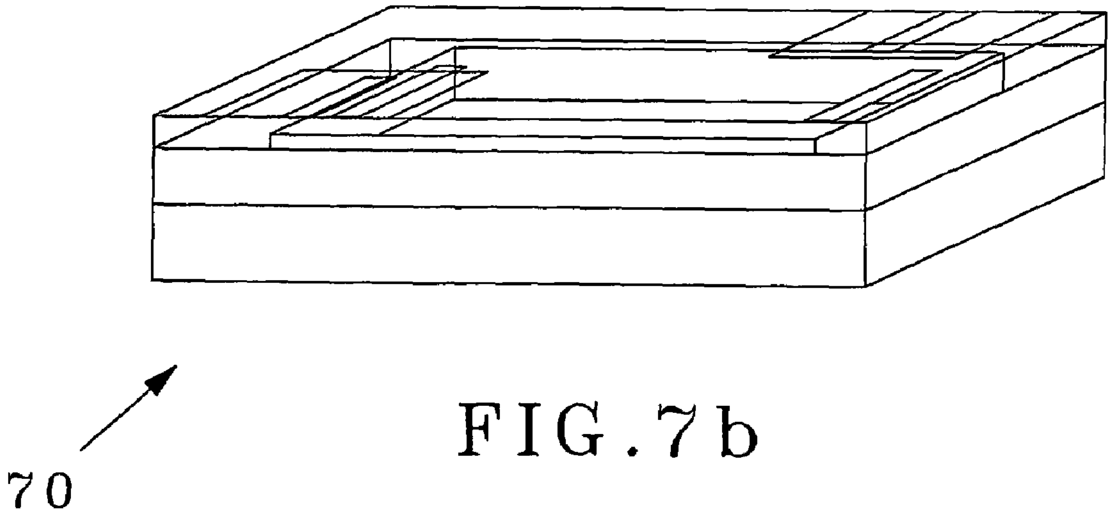
FIG. 7*b* is a perspective view of an assembled cavity resonator arrangement in FIG. 7*a*, FIGS. 8–10 illustrate exemplary coupling-network orientations for cavity resonator arrangements according to example embodiments.

To keep the size of the cavity and the manufacturing costs low CPW or Coplanar Strip (CPS) waveguide input and output-coupling networks can be used. The perspective views of FIGS. 7*a* and 7*b* illustrate an embodiment having CPS. FIG. 7*a* is an exploded view and FIG. 7*b* is an assembled resonator arrangement 70.

In contrast to the microstrip coupling, the maximum of the current, i.e. generating the magnetic field H (FIGS. 6*a* and 7*a*) is generated at the ends of the short circuit CPW and CPS. The magnetic field lines are well matched with the input and output walls of the cavity, and for this reason the total length of the cavity is not limited by the coupling networks, which is the case with the microstrip. The minimum possible length may extend to λ/2.

Figure 8:
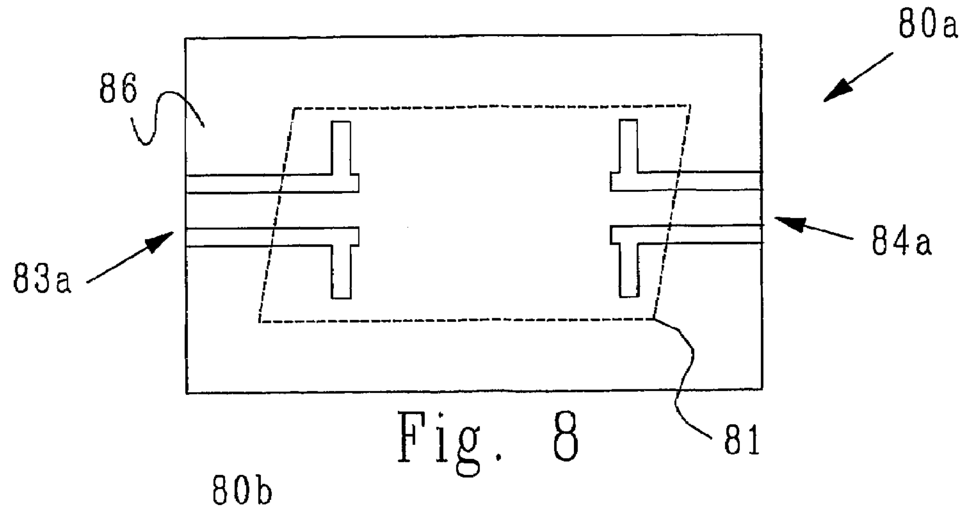
Figure 9:
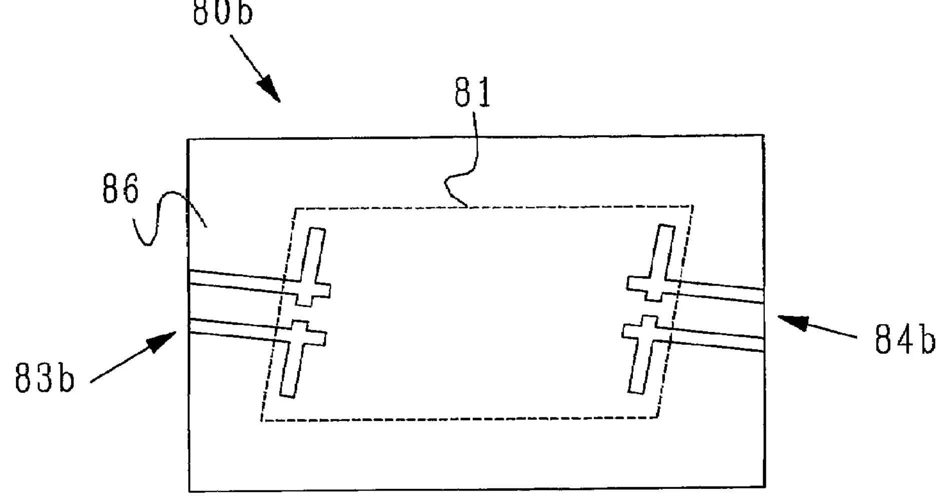
Figure 10:
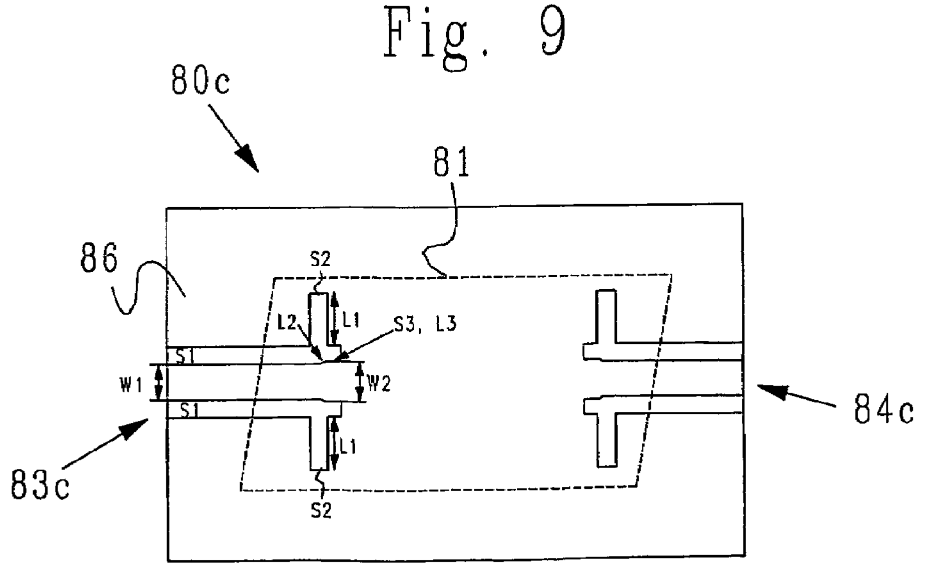

In FIGS. 8 to 10 some exemplary possible coupling-network orientations are illustrated. The dashed line 81 corresponds to the edges of the cavity in filter arrangements 80*a*–80*c*. The coupling strips are denoted with 83*a*–83*c* for inputs and 84*a*, 84*c* for outputs.

In FIG. 8, the cavity is shaped as a parallelpiped, the end section of the strips are angularly arranged relative the cavity edges. In FIG. 9, the end sections of the strips follow the cavity edges, i.e. they have same angle as the cavity edges.

In FIG. 10, stubs S2 and S3 are used for adjustment of the coupling strength of the input and output CPW with the cavity and for the matching with the impedance of input/output CPW, i.e. for reduction of the reflections from the cavity. This is achieved by optimising the dimensions L1, L2, L3, W2, S2 and S3.

Additional adjustment of the coupling strength and minimization of the reflection losses is achieved by determining the dielectric constant and the thickness of the CPW substrate and the width and length of the slot in the ground plane of the CPW, i.e. the cover of the cavity at the same time.

The filter according to the invention can be used as a high performance filter in commercial radio and telecommunication equipment, such as Bluetooth and mobile telephones, suitably but not exclusively operating over 40 GHz. Moreover, the component according to the invention can be used as a diplexer, resonator or matching network.

The invention is not limited the shown embodiments but can be varied in a number of ways without departing from the scope of the appended claims and the arrangement and the method can be implemented in various ways depending on application, functional units, needs and requirements etc.

The invention claimed is:

1. A method of fabrication of a cavity in a substrate for a component for electromagnetic waves, the method comprising the step of:

removing material from said substrate through immersing the substrate in a liquid bath of a chemical etchant to produce the cavity, the cavity comprising an opening on at least one side of said substate, the open comprising at lease four side, two of the side having an equal length, the equal length differing from lengths of remaining sides. and the opening having at least two different adjacent angles.

2. The method of claim 1 wherein said component further comprises a conductive layer arranged as a ground plane covering said substrate, said ground plane being provided with at least one coupling slot and at least one conductor, said ground plane being connected to a component element, which is inserted into said cavity in said substrate.

3. Method of claim 1, wherein said substrate is made of silicon.

4. Method according to claim 1, wherein said component is one of a filter, diplexer, resonator or matching network.

5. Method according to claim 1, wherein said substrate is etched from both sides.

6. A method of fabricating a component comprising:

(a) providing a conductive plane;

(b) arranging the conductive plane with coupling openings;

(c) providing a microwave element on a first surface of the conductive plane;

(d) providing a dielectric layer on a second surface of the conductive plane;

(e) arranging microwave conductors on the dielectric layer, (f) providing a silicon wafer with orientation;

(g) exposing selected areas on the silicon wafer to wet etching until a cavity of a desired depth is produced, the cavity comprising an opening of least four sides, two of the sides having an equal length, the equal length differing from lengths of remaining sides, and the opening having at least two different adjacent angles;

(h) covering etched surfaces resulting from act (g) by a conductor, and (i) attaching the conductive plate to the silicon wafer.

* * * * *

UNITED STATES PATENT AND TRADEMARK OFFICE

CERTIFICATE OF CORRECTION

PATENT NO. : 7,192,882 B2
APPLICATION NO. : 10/500310
DATED : March 20, 2007
INVENTOR(S) : Leif Bergstedt et al.

It is certified that error appears in the above-identified patent and that said Letters Patent is hereby corrected as shown below:

In Column 1, Line 6, delete "PCT/SE02/102457" and insert -- PCT/SE02/02457 --, therefor.

In Column 1, Line 7, delete "PCT/SE02/102457" and insert -- PCT/SE02/02457 --, therefor.

In Column 3, Line 30, after "according to" insert -- an --, therefor.

In Column 3, Line 35, after "according to" insert -- an --, therefor.

In Column 4, Line 17, delete "corn rises" and insert -- comprises --, therefor.

In Column 6, Line 17, in Claim 1, delete "at lease" and insert -- at least --, therefor.

In Column 6, Line 17, in Claim 1, after "four" delete "side" and insert -- sides --, therefor.

In Column 6, Line 17, in Claim 1, after "the" delete "side" and insert -- sides --, therefor.

In Column 6, Line 19, in Claim 1, after "sides" delete "." and insert -- , --, therefor.

Signed and Sealed this

Twenty-second Day of January, 2008

JON W. DUDAS
*Director of the United States Patent and Trademark Office*